United States Patent [19]

Young

[11] Patent Number: 4,604,578

[45] Date of Patent: Aug. 5, 1986

[54] NUCLEAR MAGNETIC RESONANCE METHODS AND APPARATUS

[75] Inventor: Ian R. Young, Sunbury-on-Thames, England

[73] Assignee: Picker International Limited, Wembley, England

[21] Appl. No.: 500,329

[22] Filed: Jun. 2, 1983

[30] Foreign Application Priority Data

Jun. 9, 1982 [GB] United Kingdom ................. 8216714

[51] Int. Cl.[4] ............................................ G01R 33/20
[52] U.S. Cl. .................................................. 324/307
[58] Field of Search ............... 324/309, 307, 312, 207, 324/208, 306; 128/1.3, 1.4, 1.5, 653; 378/205, 206

[56] References Cited

U.S. PATENT DOCUMENTS

| 4,197,855 | 4/1980 | Lewin | 128/653 |
|---|---|---|---|
| 4,303,077 | 12/1981 | Lewin et al. | 128/777 |
| 4,317,078 | 2/1982 | Weed et al. | 128/653 |
| 4,342,086 | 7/1982 | Adib | 128/653 |
| 4,379,262 | 4/1983 | Young | 324/309 |
| 4,442,404 | 4/1984 | Bergmann | 324/309 |
| 4,528,510 | 7/1985 | Loeffler et al. | 324/309 |

FOREIGN PATENT DOCUMENTS

| 0004888 | 3/1979 | European Pat. Off. . | |
| 2854774 | 7/1980 | Fed. Rep. of Germany . | |
| 2386807 | 3/1978 | France . | |
| 2027208 | 2/1980 | United Kingdom . | |
| 2049947 | 12/1980 | United Kingdom . | |
| 2076542 | 12/1981 | United Kingdom . | |
| 308342 | 9/1971 | U.S.S.R. | 324/306 |

OTHER PUBLICATIONS

Moran, P. R., "A Flow Zeugmatographic Interlace for NMR Imaging in Humans", Magnetic Resonance Imaging, vol. 1, pp. 197–203, 1983.

Johnson et al., "Instrumentation for NMR Spin–Warp Imaging", Journal of Physics E: Scientific Instruments, vol. 15, No. 1, Jan. 1982, pp. 74–79.

Respiratory Gating in Magnetic Resonance Imaging at 015 Tesla, Runge, V. M. et al, Radiology 1984: 151: 521–523.

Primary Examiner—Reinhard J. Eisenzopf
Assistant Examiner—Kevin D. O'Shea
Attorney, Agent, or Firm—Watts, Hoffmann, Fisher & Heinke Co.

[57] ABSTRACT

In a method of investigating the distribution of a quantity in a chosen region of a body (E) by nuclear magnetic resonance techniques movement of the body during the investigation is monitored by probes (A, B C) attached to the body and responsive to magnetic fields applied to the body during the investigation. An apparatus for carrying out the method is also described.

14 Claims, 5 Drawing Figures

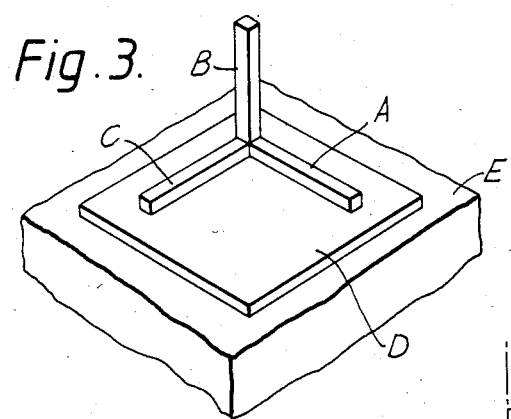
Fig. 3.
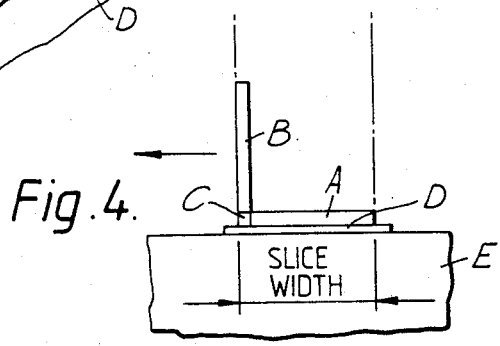
Fig. 4.
Fig. 5.
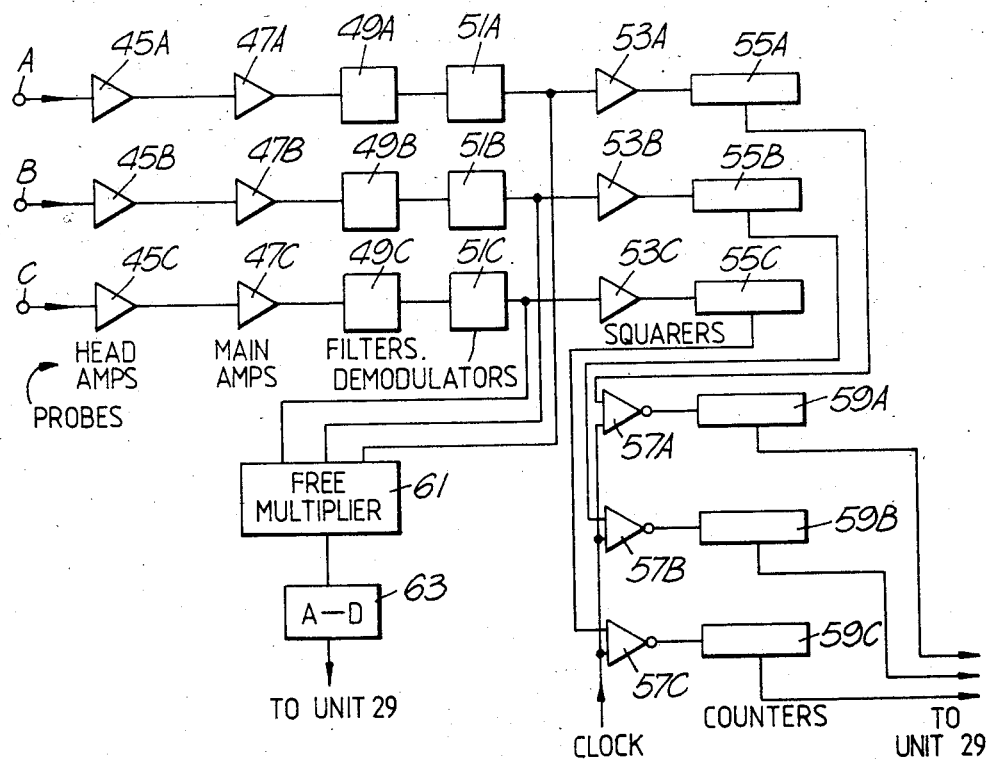

NUCLEAR MAGNETIC RESONANCE METHODS AND APPARATUS

This invention relates to methods and apparatus for investigating the distribution of a quantity in a chosen region of a body by nuclear magnetic resonance (NMR) techniques.

NMR techniques have been used for the analysis of materials for many years. More recently NMR techniques have been used to obtain distributions in sectional slices or volumes of a body of the density of chosen nuclei, for example hydrogen protons, or of NMR spin relaxation time constants. Such distributions are similar to, although of different significance from, the distributions of X-ray attenuation provided by computerised tomography systems, and have thus found especial application in medical examination of patients.

Practical NMR apparatuses operate by the application of sequences of magnetic fields to the body being examined to excite resonance in a region of the body, and detecting resultant induced currents in one or more detector coil systems. Suitable sequences of magnetic fields and apparatus to carry out the sequences are disclosed, for example, in UK Patent Specification Nos. 1,578,910, 1,584,948, 1,584,949 and 1,584,950.

Examination of a body using such methods and apparatus can take an appreciable time, that is from a few seconds to several minutes.

It is therefore necessary for the body being examined to remain still, or for movement of the body to be tracked and corrected for, the latter clearly being the preferable alternative in the case of medical examination of a patient to avoid undue restriction of the patient.

The more obvious methods of tracking movement are unfortunately difficult to apply in the case of NMR apparatus. Thus optical surveillance of the body is obstructed by the close proximity to the body of the coil systems by which the sequences of magnetic fields are applied. Capacitive methods of body position location are in general impracticable due to difference in size and shapes of bodies under examination.

It is an object of the present invention to provide a method and apparatus for investigating the distribution of a quantity in a chosen region of a body by NMR techniques wherein this problem is overcome.

According to the present invention there is provided a method for investigating the distribution of a quantity in a chosen region of a body by NMR techniques wherein an indication of movement of the body during the investigation is obtained by monitoring signals produced by probe means attached to the body and responsive to a magnetic field applied to the body during the investigation.

Preferably the probe means comprises at least one NMR probe, that is a probe which provides an output signal by virtue of the excitation of nuclear magnetic resonance of material contained in the probe.

In one particular method in accordance with the invention said probe means comprises three probes each of which is of elongated form, and said probes are disposed with their respective major dimensions in mutually orthogonal relationship.

The invention also provides apparatus for carrying out a method according to the invention.

Hence, the invention also provides an apparatus for investigating the distribution of a quantity in a chosen region of a body by NMR techniques including: probe means adapted for attachment to the body during the investigation and responsive to a magnetic field applied to the body during the investigation; and means for monitoring the signals produced by said probe means during the investigation to provide an indication of movement of the body during the investigation.

One method and apparatus in accordance with the invention will now be described, by way of example, with reference to the accompanying drawings in which:

FIGS. 3 and 4 illustrate the disposition of three probes used in the apparatus for monitoring movement of a body under examination; and FIG. 5 is a block schematic diagram of a circuit utilising output signals provided by the probes of FIGS. 3 and 4.

Apart from a means for monitoring movement of a body under examination, the apparatus is essentially identical to that described in the above-mentioned UK patent specifications to which reference should be made for a fuller description of the apparatus.

The essential features of such apparatus and its method of operation, in so far as is necessary for an understanding of the present invention, are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
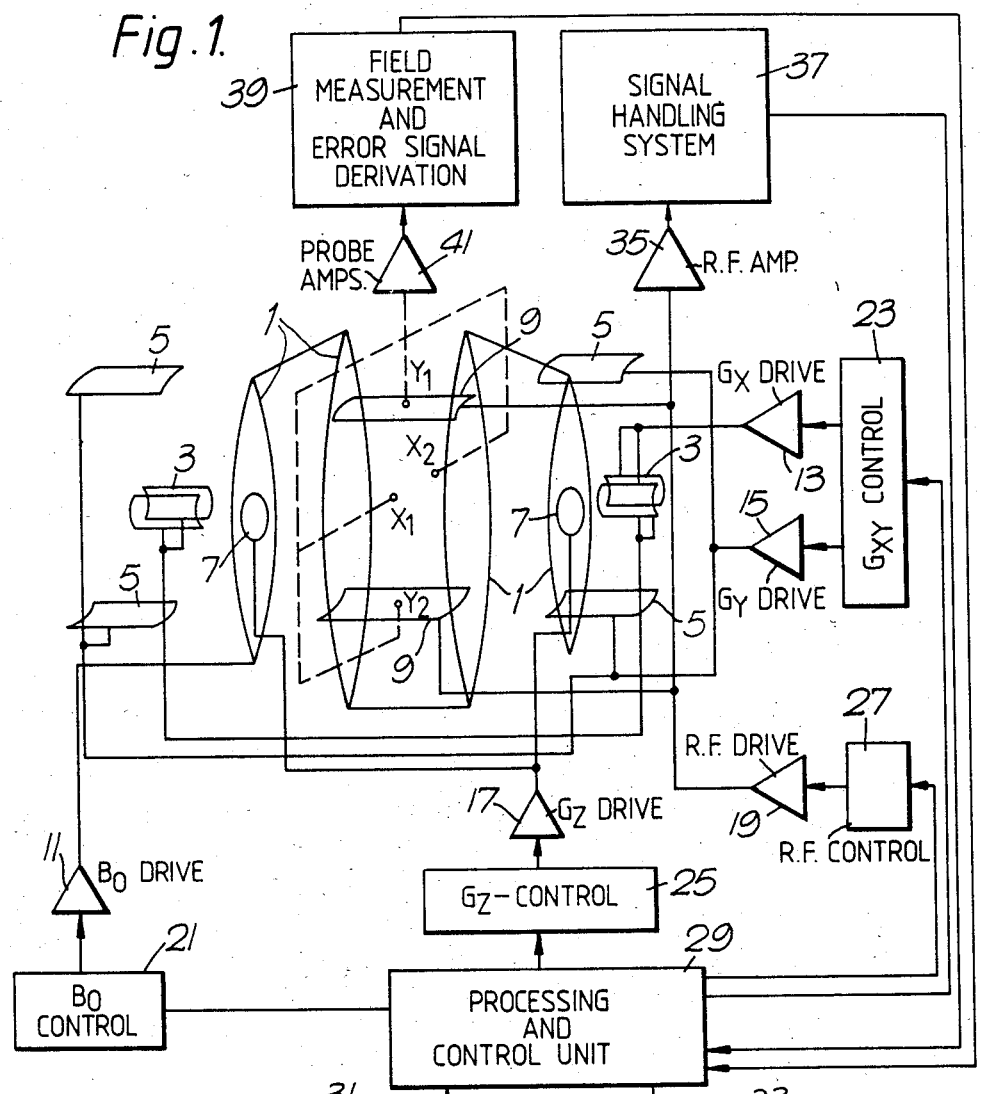
FIGS. 1 and 2 illustrate the apparatus diagrammatically.

Referring to FIG. 1, the first coil system comprises coils 1 which provide a steady uniform magnetic field $B_o$ in the Z-direction; coils 3 which provide a magnetic field gradient $G_x$ in the X-direction, coils 5 which provide a magnetic field gradient $G_y$ in the Y-direction; and coils 7 which provide a magnetic field gradient $G_z$ in the Z-direction.

In addition, the apparatus includes a second coil system 9 whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

In the drawing a single pair of coils 9 is shown for both applying and detecting RF fields, but in certain circumstances it may be preferable to provide separate coils for detecting the RF fields.

The various coils 1, 3, 5, 7 and 9 are driven by $B_o$, $G_x$, $G_y$, $G_z$ and RF drive amplifiers 11, 12, 13, 15, 17 and 19 respectively, controlled by $B_o$, $G_{xy}$, $G_z$ and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

Figure 2:
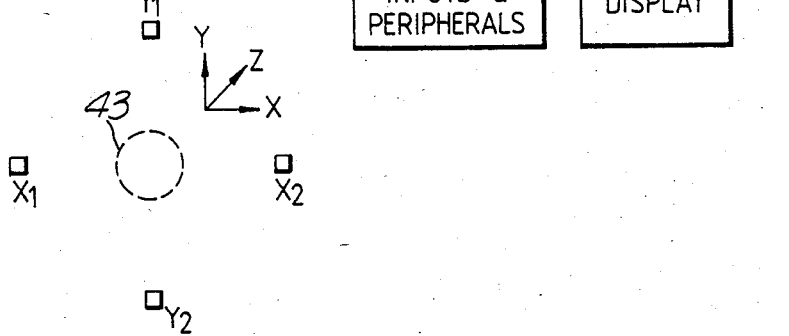

The apparatus also includes field measurement and error signal circuits 39 which receive signals via amplifiers 41 from field probes $X_1$, $X_2$, $Y_1$ and $Y_2$ which are disposed at suitable positions in relation to a slice 43 of the body being examined, as illustrated in FIG. 2, to monitor the applied magnetic fields.

In operation of the apparatus a magnetic field is first applied to the body with a gradient in a chosen direction, hereinafter taken to be the Z-direction, using the first coil system, so that a unique, uniform magnetic field is applied to a selected region, e.g. a cross-sectional slice of the body. With this field applied an RF magnetic field at the Larmor frequency for the unique field in the selected slice is then applied by means of the second coil system, thereby causing nuclear magnetic excitation of protons in the selected slice.

The Z-direction gradient field is then replaced by a gradient field with gradients in one or both of the other two directions i.e. the X and Y directions in this example, to produce a resultant gradient in a chosen direction in the plane of the selected slice. As a result the resonance frequency of protons in the selected slice is dispersed in the direction of the new gradient and the slice is effectively divided into a number of parallel strips each extending in a direction perpendicular to the new gradient, in each of which the proton resonance frequency is different. Hence, by analysis of the spectrum of the resulting signals detected by the second coil system data may be collected for protons in each strip in respect of a chosen nuclear magnetic resonance quantity such as density, or alternatively or additionally spin-to-lattice or spin-to-spin relaxation time. In some methods the data collected is similar in nature to the edge values obtained during X-ray computerised tomography.

By repeating the process for the same selected slice for each of a number of different orientations of the data collection gradient, edge values for each of a number of orientations of the strips in the selected slice are obtained, and the resulting signals are processed in a similar manner to that used in X-ray computerised tomography to obtain a value of the chosen NMR quantity for each of a plurality of discrete locations in the selected slice. Using the signals so obtained an image representing the distribution of the chosen NMR quantity throughout the selected slice may be displayed.

It will be apparent that in order to obtain meaningful results the region of the body under examination must remain stationary with respect to the first and second coil systems throughout the whole sequence of slice selections and data collections, or the movement of the body must be monitored and allowance for such movement be made.

In accordance with the present invention movement of the body under examination is monitored by means of one or more NMR probes attached to the body being examined.

Referring to FIG. 3 in the particular example in accordance with the invention being described three probes A, B and C are used each of which is of generally rectangular form and square-cross-section. The three probes A, B and C are secured to a support D, such as an adhesive pad, adapted to be attached to the body E under examination, the probes being disposed on the support D with their major axes mutually orthogonal. The length of each probe is approximately equal to the width of a selected slice and the width and breadth of each probe are approximately equal to the width and breadth of a pixel of the image obtained in use of the apparatus.

The support is positioned so that one probe A initially lies across an extension beyond the body E of the slice of the body under examination to be selected, and the other two probes B and C initially lie in such an extension of the slice closely adjacent the plane of one of the major surfaces of the slice, as shown in FIG. 4.

In operation, when a slice is excited to nuclear magnetic resonance, the probes if correctly positioned are similarly excited, and consequently produce detectable output signals. If, after a slice selection, the level of signal produced by the probe nominally positioned across the slice has fallen relative to the signal obtained after the preceding slice selection, then this can be taken as an indication that this probe no longer wholly lies in a field of the required strength for excitation to occur, and hence that the body has moved in one or the other direction normal to the plane of the slice. An indication of the direction of movement is given by the output signals of the other two probes. Thus, loss of signal from these two probes will occur for any movement of the probes with respect to the slice in the direction of the arrow in FIG. 4, but no loss will occur for small movements in the reverse direction.

In this way the position of the body during each slice selection is monitored to determine whether it was in the required position during slice selection.

It will be appreciated that, in respect of slice selection, movement of the body in the X and Y directions is of no consequence and does not need to be monitored.

During data collection periods, movement in the Z-direction is of no consequence but movement in the X - Y plane in which a gradient is applied must be monitored. Since the frequency of the output signal of each probe depends on field strength at the probe, such movement can be detected by monitoring the frequencies of the probe output signals during data collection. However, due to the rotation of the direction of the applied gradient in the X - Y plane from one data collection period to another, it may prove difficult to interpret the probe output signals. In this case the frequencies of the outputs of the probes may be taken at suitable intervals e.g. after each data collection period, with fixed reference gradient magnetic fields applied, and successive readings compared.

This technique may also be used for monitoring slice movement if for any reason it is not convenient to position the probes actually in the slice to be selected so that the probes have to be excited separately from the slice of the body to be examined.

It will be appreciated that since the measurements taken are relative ones, accurate positioning of the probes is not important.

The probes suitably comprise a small container of water surrounded by a sensing coil. The water may be doped to have suitable NMR characteristics. For example, where measurements are taken with reference gradient fields as described above, the water is preferably doped to exhibit short spin-lattice relaxation time to reduce the required interval between successive readings.

A suitable circuit for deriving signals from the probes for input to the processing and control unit 29 for analysis is shown in FIG. 5.

The arrangement includes respective head and main amplifiers 45A, 45B, 45C and 47A, 47B and 47C for each probe A, B and C whose outputs are passed via respective band-pass filters 49A, 49B and 49C to respective demodulators 51A, 51B and 51C, which produce output signals representative of the difference of the frequencies of the probe output signals and a reference signal of frequency f.

The output signals of the demodulators are applied via waveform squaring circuits 53A, 53B and 53C to respective reference counters 55A, 55B and 55C which accumulate to a fixed number of cycles (say ten). The reference counters 55A, 55B and 55C control respective gates 57A, 57B and 57C whereby clock pulses are supplied to further counters 59A, 59B and 59C whilst the reference counters are running, the contents of the further counters 59A, 59B and 59C being fed to the processing and control unit 29 (FIG. 1) wherein they are analysed to determine any movement of the body.

As a result of such determination, the collected data may be retaken after appropriate adjustment, e.g. a change in the frequency of the RF excitation pulse to shift the selected slice in the appropriate direction. Alternatively due allowance may be made for the movement in processing the collected data.

Signals for use by the unit 29 as reference readings to determine the condition of the probes A, B and C immediately prior to the commencement of an investigation and for determining whether the body was in the required position during slice selection are derived from the outputs of the demodulators 51A, 51B and 51C by way of a frequency multiplier 61 and an analogue to digital converter 63.

It will be understood that whilst one particular method and apparatus embodying the invention has been described above by way of example, that it, a method and apparatus using a particular resonance excitation sequence and image reconstruction technique, the present invention is equally applicable to other NMR methods and apparatus employing different excitation sequences and image reconstruction techniques.

I claim:

1. A method for investigating the spatial distribution of a quantity of substance in a chosen region of a body by NMR techniques incorporating the additional step of obtaining an indication of physical movement of the body during the NMR investigation by monitoring signals produced by a probe means attached to the body whose movement is being monitored, said probe being responsive to a magnetic field applied to the body during the NMR investigation.

2. The method of claim 1, wherein said monitoring step comprises utilizing at least one NMR probe.

3. An apparatus for investigating the spatial distribution of a quantity of material in a chosen region of a body of NMR techniques including: probe means adapted for attachment to the body during the NMR investigation and being responsive to a magnetic field applied to the body during the investigation; and means for monitoring the signals produced by said probe means in response to said magnetic field during the NMR investigation to provide an indication of physical movement of the body during the investigation.

4. An apparatus according to claim 3 wherein said probe means comprises at least one NMR probe.

5. An apparatus according to claim 3 wherein said means for monitoring comprises means for monitoring the level of the signals produced by said probe means.

6. A method for investigating the spatial distribution of a quantity of susbtance in a chosen region of a body by NMR techniques wherein an indication of movement of the body during investigation is obtained by monitoring signals produced by at least one NMR probe means attached to the body and responsive to a magnetic field applied to the body during investigation, said probe being disposed with its major dimension substantially parallel to the direction of the gradient of a different gradient magnetic field which may be applied to the body during the investigation.

7. The method of claim 6, wherein one probe is initially positioned so that it lies across an extension beyond the body of the slice of the body to be investigated, and two other probes initially lie in a said extension of said slice, adjacent the plane of one of the major surfaces of the slice.

8. A method for investigating the spatial distribution of a quantity of substance in a chose region of a body by NMR techniques, wherein an indication of movement of the body during investigation is obtained by monitoring signals produced by probe means attached to the body and responsive to a magnetic field applied to the body during investigation, said investigation comprising causing nuclear magnetic excitation of nuclei in a selected region of the body, applying a gradient magnetic field in a chosen direction in the selected region to disperse the resonance frequency of excited nuflei in the direction of the gradient, and causing the resonance signals during the application of said gradient field, wherein the signals produced by said probe means are monitored after excitation of the nuclei in said region, before application of said gradient field, and said signals are subsequently monitored during the application of said gradient field.

9. A method for investigating the spatial distribution of a quantity of substance in a chosen region of a body by NMR techniques wherein an indication of movement of the body during investigation is obtained by monitoring signals produced by probe means attached to the body and responsive to a magnetic field applied to the body during investigation, wherein the signals produced by said probe means are monitored with at least one fixed reference gradient magnetic field applied.

10. An apparatus for investigating the spatial distribution of a quantity of material in a chosen region of a body by NMR techniques, said apparatus including: probe means adapted for attachment to the body during the investigation and responsive to a magnetic field applied to the body during the investigation; and means for monitoring the signals produced by said probe means during the investigation to provide an indication of movement of the body during the investigation, said probe means comprising three probes each of which is of elongated form, said probes being disposed with their respective major dimensions in mutually orthogonal relationship.

11. An apparatus for investigating the spatial distribution of a quantity of material in a chosen region of a body by NMR techniques including: probe means adapted for attachment to the body during the investigation and responsive to a magnetic field applied to the body during investigation; means for monitoring the signals produced by said probe means during the investigation to provide an indication of movement of the body during the investigation, said monitoring means comprising means for monitoring the frequency of the signal produced by said probe means.

12. The apparatus of claim 11, wherein said means for monitoring comprises first counter means arranged to accumulate a fixed number of cycles of the signals produced by said probe means, and second counter means arranged to count clock pulses while the first counter means is running.

13. The apparatus of claim 12, wherein said means for monitoring includes demodulator means responsive to said signals produced by said probe means and a reference signal to produce a signal representative of the difference of the frequencies of said probe means and reference signals, and said first counter means is responsive to said difference frequency signal.

14. A method for investigating the spatial distribution of a quantity of substance in a chosen region of a body by NMR techniques, wherein an indication of movement of the body during investigation is obtained by monitoring signals produced by a probe means attached to the body and responsive to a magnetic field applied to the body during investigation, said probe means including three probes, each having an elongated configuration, and wherein said monitoring step comprises disposing the three probes with their respective major dimensions in mutually orthogonal relationship.

* * * * *